United States Patent [19]
Lahey et al.

[11] Patent Number: 5,870,332
[45] Date of Patent: Feb. 9, 1999

[54] HIGH RELIABILITY LOGIC CIRCUIT FOR RADIATION ENVIRONMENT

[75] Inventors: Michael D. Lahey; Debra S. Harris; Harry N. Gardner, all of Colorado Springs, Colo.; Michael J. Barry, Tigard, Oreg.

[73] Assignee: United Technologies Corporation, Hartford, Conn.

[21] Appl. No.: 635,794

[22] Filed: Apr. 22, 1996

[51] Int. Cl.$^6$ .................................................. G11C 11/40
[52] U.S. Cl. ...................................... 365/156; 365/189.05
[58] Field of Search .................. 326/11, 30; 365/189.05, 365/156

[56] References Cited

U.S. PATENT DOCUMENTS

| | | | |
|---|---|---|---|
| 4,782,467 | 11/1988 | Belt et al. | 365/154 |
| 4,785,200 | 11/1988 | Huntington | 307/279 |
| 4,896,056 | 1/1990 | Kunieda et al. | 326/30 |
| 4,950,620 | 8/1990 | Harrington, III | 437/60 |
| 5,021,683 | 6/1991 | Schemmel | 307/279 |
| 5,028,817 | 7/1991 | Patil | 326/30 |
| 5,031,180 | 7/1991 | McIver et al. | 371/36 |
| 5,039,876 | 8/1991 | Hochwald et al. | 307/278 |
| 5,075,570 | 12/1991 | Shewchuk et al. | 307/279 |
| 5,111,429 | 5/1992 | Whitaker | 365/156 |
| 5,175,605 | 12/1992 | Pavlu et al. | 257/369 |
| 5,196,841 | 3/1993 | Harder et al. | 340/825 |
| 5,307,142 | 4/1994 | Corbett et al. | 365/156 |
| 5,311,070 | 5/1994 | Dooley | 307/279 |
| 5,406,513 | 4/1995 | Canaris et al. | 365/181 |
| 5,418,473 | 5/1995 | Canaris | 326/27 |
| 5,471,426 | 11/1995 | McClure | 365/200 |
| 5,504,703 | 4/1996 | Bansal | 365/156 |

*Primary Examiner*—David C. Nelms
*Assistant Examiner*—Michael T. Tran

[57] ABSTRACT

A high reliability logic circuit designed to withstand a single event upset (SEU) induced by an ion transitioning through a semiconductor structure is embodied in a memory circuit which includes a first memory cell and a second memory cell. The first and second memory cells receive a first input signal and a second input signal. The memory cells contain a logic circuit for producing a logic signal output driven by either a pullup or pulldown driver when the first and second input signals are of a desired logic state and produces a high impedance output if either input signal is not of their respective desired logic states.

The memory cells also have sufficient nodal capacitance such that the output from the first or second memory cell will not be corrupted by an SEU in the logic circuit of either the first or second memory cell.

The outputs of the first memory cell and second memory cell are further summed in analog fashion to produce a single output from the memory circuit. The summing of the output signals from the first and second memory cell prevents a single error in either memory cell from propagating to a next stage.

23 Claims, 9 Drawing Sheets

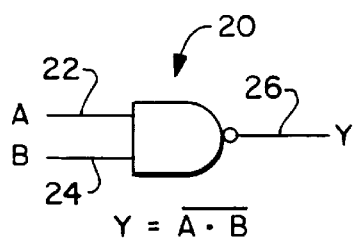
FIG. 1
PRIOR ART
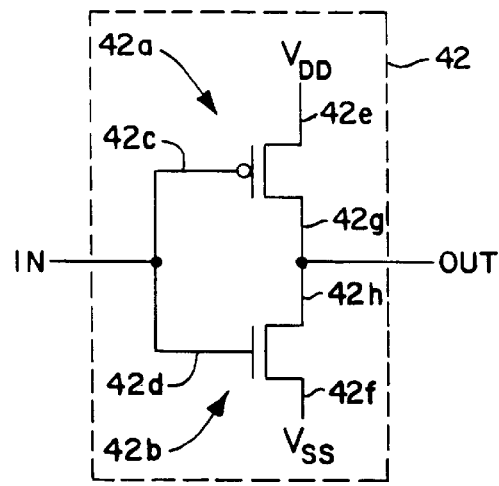
FIG. 3
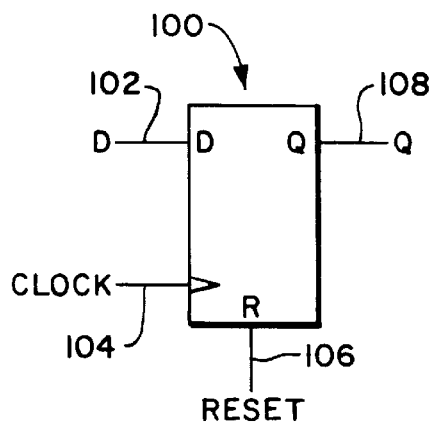
FIG. 5
PRIOR ART
| | D | CLOCK | RESET | Q |
|---|---|---|---|---|
| 112 | X | X | H | L |
| 114 | H | ↑ | L | H |
| 116 | L | ↑ | L | L |
| 118 | X | L | L | $Q_0$ |
FIG. 6

HIGH RELIABILITY LOGIC CIRCUIT FOR RADIATION ENVIRONMENT

TECHNICAL FIELD

This invention relates to semiconductor electronic circuits and more particularly to semiconductor logic circuits.

BACKGROUND ART

A single event upset (SEU) is the result of an ion transitioning through a semiconductor structure and depositing charge on a critical circuit node within that structure. In a CMOS logic circuit, this can cause an unintended switch in the logic state, creating potentially catastrophic consequences for the system. In the case of storage cells, the primary SEU problem lies in the feedback path, where amplification and feedback of noise on a critical node can permanently change the cell's logic state.

Known SEU hardening techniques for CMOS logic include the use of redundant circuit paths, and for storage cells it is known to use cross-coupled resistors or capacitors. Dual circuit paths provide redundancy and allow implementation of voting schemes to reduce the effect of SEUs. The addition of cross-coupled resistors and capacitors in a storage cell slows the cell's ability to latch false data. However, each of these techniques has its drawbacks. The typical voting scheme uses digital logic to recombine the redundant paths, and thereby actually provides amplification of the SEU. The addition of cross-coupled resistors and capacitors in a storage cell involves more complicated fabrication processes and results in slower response to all input signals, thereby decreasing its operating speed.

DISCLOSURE OF INVENTION

An object of the present invention is to provide a logic circuit architecture which has higher reliability in a radiation environment.

Still another object of the present invention is to provide circuitry for a family of logic products having higher reliability in a radiation environment.

According to the present invention, a dual memory cell, includes a first memory cell receiving a first logic state input signal and providing an output signal, and further includes a second memory cell receiving a second logic state input signal and providing an output signal, where the first and second memory cell and second memory cell further receive and respond to one or more logic signals from the other.

In further accord with the present invention, the output signal of the first memory cell and the output signal of the second memory cell may be further combined to provide one resultant logic state output signal.

In still further accord with the present invention, apparatus for performing a selected logic function includes an input section which receives one or more logic state input signals and provides a pair of buffered logic state signals for each, and further includes, a logic section having a first and second portion, each receiving one logic state signal from each of the pairs of buffered logic state signals, and each performing the selected logic function on the logic state signals received thereby to each provide one or more output signals, said first portion having a first memory cell and said second portion having a second memory cell, said first memory cell farther receiving and responding to one or more logic signals from said second memory cell, and said second memory cell further receiving and responding to one or more logic signals from said first memory cell, and each of said output signals from the first portion combined in analog fashion with a corresponding one of the output signals from the second portion to provide one or more logic section output signals, and further includes an output section receiving each of the one or more logic section output signals and providing one or more resultant logic output signals.

The present invention provides a logic circuit having higher reliability in a radiation environment. The present invention further provides circuitry for a family of products having higher reliability in a radiation environment with little impact to the die size and no decrease in functionality.

These and other objects, features, and advantages of the present invention will become apparent in light of the following detailed description of a best mode embodiment, accompanying Drawings, and claims.

BRIEF DESCRIPTION OF THE DRAWINGS

FIG. 1 is a schematic illustration of a NAND logic function, which is used in the description of the present invention;

FIG. 3 is a schematic illustration of one element used in the embodiment of FIG. 2;

FIG. 5 is a schematic illustration of a flip flop logic function which is used in the description of the present;

FIG. 6 is a truth table illustration for the flip flop of FIG. 5;

BEST MODE FOR CARRYING OUT THE INVENTION

Figure 2:
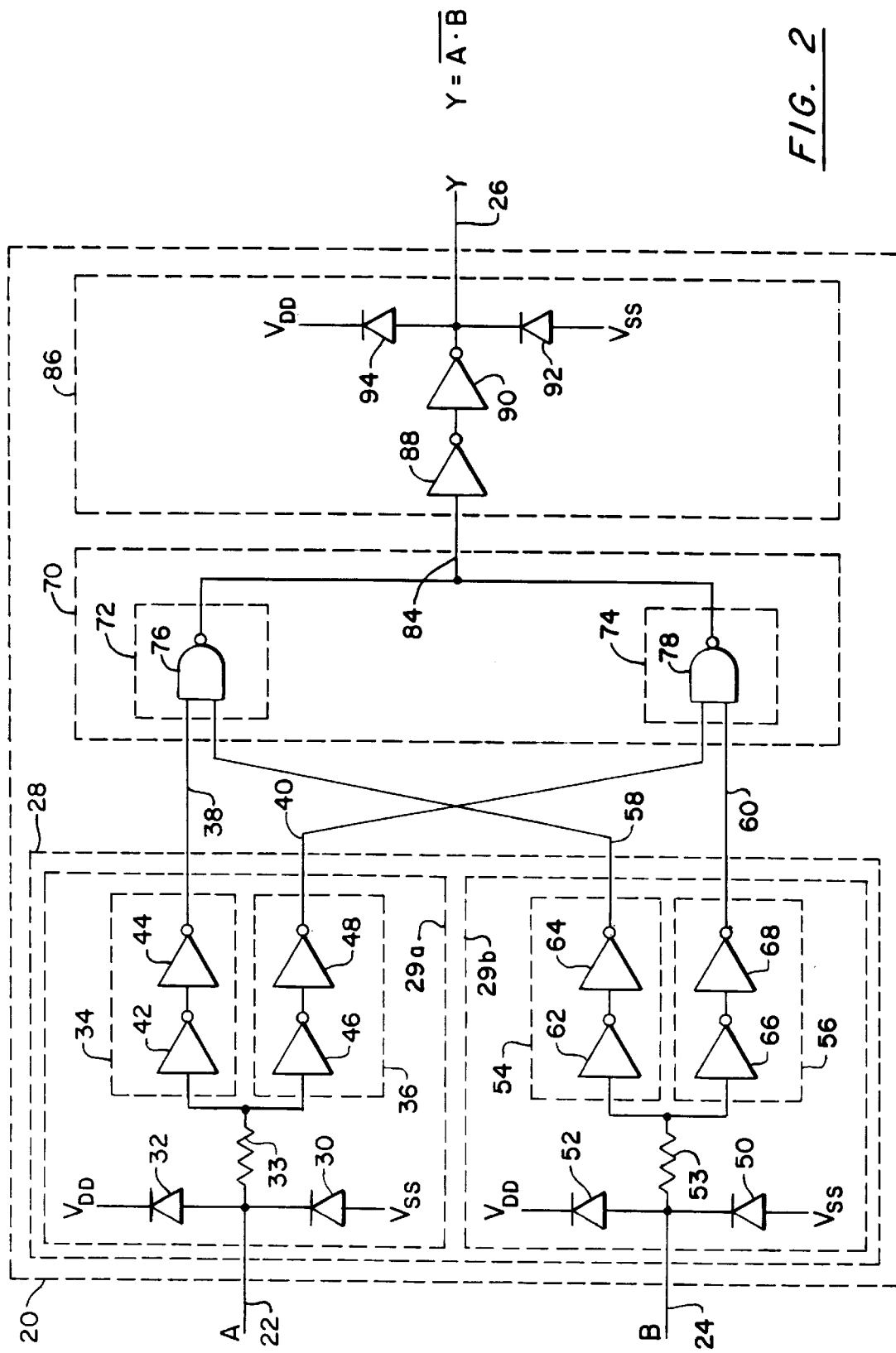
FIG. 2 is a schematic illustration of the best mode embodiment of the present invention as used in the NAND logic function of FIG. 1.

The apparatus of the present invention is disclosed with respect to a best mode embodiment for use in a logic circuit providing the NAND logic function represented in FIG. 1. As should be understood by those skilled in the art, the drawing figures are only schematic representations, and are not intended to portray physical details.

Referring to FIG. 1, in a prior art schematic of a selected logic device, a two input NAND circuit 20 receives logic signal A on line 22 and logic signal B on line 24, and produces a NAND logic output signal Y on line 26. As known, the logical operation of the NAND circuit 20 can be described by the equation Y=NOT(A·B).

Referring now to FIG. 2, in the present invention's best mode embodiment of the NAND circuit 20 of FIG. 1, logic signal A on line 22 and logic signal B on line 24 are each received by an input section 28.

Each of the logic signals on lines 22, 24 are presented to an associated one of a pair of signal conditioning circuits 29a, 29b within the input section 28. As described hereinafter, the signal conditioning circuits 29a, 29b are identical. The circuit 29a has a diode 30 which provides protection against logic signal A magnitudes less than the lower power supply voltage magnitude $V_{SS}$, and a diode 32 which provides protection against logic signal A magnitudes greater than the upper power supply voltage magnitude $V_{DD}$. In the best mode embodiment $V_{SS}$ is approximately zero (0) volts and $V_{DD}$ is in the range of from 4.5 to 5.5 volts. To afford the best protection, the diodes 30, 32 are physically located as close to where the input signal on line 22 is received, as is practical. In situations where the input signal A on line 22 cannot exceed the magnitude range of the power supplies, such as where the source of logic signal A resides on the same integrated circuit as the NAND circuit 20, the two diodes 30, 32 may not be necessary.

The circuit 29a further comprises a series resistor 33 that is electrically connected between the diodes 30, 32 and the signal inputs a pair of buffer stages 34, 36. The resistor 33 provides electrostatic discharge protection (ESD) on line 22. The buffer stages 34, 36 each receive the ESD protected signal and provide a pair of buffered, redundant A signals on lines 38, 40 respectively. The pair of buffer stages 34, 36 represent independent signal paths, such that, a failure in one of the pair of buffer stages 34, 36 will not disturb the logic signal out of the other. To further this end, in the best mode embodiment, the pair of buffer stages 34, 36 are physically spaced further apart than normal so that the effect of a single ion transitioning through the semiconductor structure is less likely to cause single event upset (SEU) in both of the pair of buffer stages 34, 36.

In the best mode embodiment, the pair of the buffer stages 34, 36 provide the same logic function, non inverting buffering, and comprise logic gates of the same type, so that the pair of buffered A signals on lines 38, 40 are substantially similar to each other in logic state and timing. However, as will be obvious to those skilled in the art, one or both of the pair of buffer stages 34, 36 may provide a logic function other than non inverting buffering, so long as suitable modifications are made to other logic, described below, in the NAND circuit 20.

In the best mode embodiment, each of the buffer stages 34 and 36, comprise cascaded first and second inverter 42, 44 and 46, 48, respectively. The inverters are shown to be identical. The first inverters 42, 46 buffer and invert the logic signal. The second inverters 44, 48 restore the logic states of the pair of buffered A signals on lines 38, 40 to that of the input signal A on line 22.

FIG. 3 is a circuit for the inverter 42, which comprises a P channel MOSFET 42a and an N channel MOSFET 42b. The input pin (IN) of the first inverter 42 is electrically connected to the gate 42c of the P channel and the gate 42d of the N channel MOSFETs. The source 42e of the P channel is connected to $V_{DD}$ and the source 42f of the N channel is connected to $V_{SS}$. The drain 42g of the P channel MOSFET is connected to the drain 42h of the N channel which then serves as the output (OUT) for the first inverter 42. The other inverters 44, 46, 48 have similar transistor level circuits to that of the first inverter 42.

The operation of the first inverter 42 is as follows. When the signal input at IN is at a high logic state voltage, the N channel MOSFET 42b is "on", i.e. its resistance from drain to source is low, and the P channel MOSFET 42a is "off", i.e. its resistance from drain to source is high. At the output, this produces a low resistance to the $V_{SS}$ supply and a high resistance to the $V_{DD}$ supply. The result is a voltage on the output (OUT), approximately equal to $V_{SS}$, which represents a low logic state. When IN is at a low logic state voltage, the P channel MOSFET 42a is "on" and the N channel MOSFET 42b is "off". At the output, this produces a low resistance to the $V_{DD}$ supply and a high resistance to the $V_{SS}$ supply. The result is a voltage on the output (OUT), approximately equal to $V_{DD}$, which represents a high logic state.

Referring again to FIG. 2, the B input logic signal on line 24 is received by signal conditioning circuitry 29b which is similar to that described with respect to circuit 29a. Two diodes 50, 52 provide under voltage and over voltage protection. In situations where the input signal B on line 24 can not exceed the range of the power supplies the two diodes 50, 52 may not be necessary. A series resistor 53 is positioned after the two diodes 50, 52 to provide electrostatic discharge protection (ESD) on the input signal B on line 24. The ESD protected input signal is then passed to a pair of buffer stages 54, 56 which provide a pair of buffered B signals on lines 58, 60 respectively. A failure in one of the pair of buffer stages 54, 56 will not disturb the logic signal out of the other. In the best mode embodiment, the pair of buffer stages 54, 56 are physically spaced further apart than normal so that the effect of a single ion is less likely to cause single event upset (SEU) in both of the pair of buffer stages 54, 56.

In the best mode embodiment, the pair of buffer stages 54, 56 provide the same logic function, non inverting buffering, and comprise logic gates of the same type, so that the pair of buffered B signals on lines 58, 60 are substantially similar to each other in logic state and timing. As will be obvious to those skilled in the art, one or both of the pair of buffer stages 54, 56 may provide a logic function other than non inverting buffering, so long as suitable modifications are made to other logic, described below, in the NAND circuit 20.

In the best mode embodiment, each of the buffer stages 54 and 56, comprise a first and second inverter 62, 64 and 66, 68, respectively. The first inverters 62, 66 buffer and invert the input signal B on line 24. The second inverters 64, 68 restore the logic states of the pair of buffered B signals on lines 58, 60 to that of the input signal B on line 24. All four of these inverters 62, 64, 66, 68 have similar transistor level circuits to that of the first inverter 42. The NAND circuit 20 further comprises a logic section 70 having a first portion 72 and a second portion 74. The first and second portions 72, 74 each receives one signal from each of the buffered A and B signal pairs on lines 38, 40 and 58, 60. The first and second portions 72, 74 represent independent signal paths, such that, a failure in one will not disturb the logic of the other. To this end, in the best mode embodiment, the portions 72, 74 are physically spaced further apart than normal so that the effect of a single ion transitioning through the semiconductor structure is less likely to cause single event upset (SEU) in both portions 72, 74.

Each portion 72, 74 comprises the logic necessary to enable it to provide the overall logic function of the circuit, e.g. the NAND logic function of the NAND circuit 20 in the best mode embodiment. The appropriate logic depends not only on the overall logic function of the circuit, but also on the logical effect of the input section 28 buffer stages 34, 36, 54, 56 and the output section, described hereinbelow. In the best mode embodiment, the input section 28 buffer stages 34, 36, 54, 56 and the output section are non inverting buffers, and therefore have no logical effect. Consequently, the logic for the first and second portions 72, 74 of the logic section 70 each need only comprise a NAND gate 76, 78, or its equivalent, to provide the NAND function.

Figure 4:
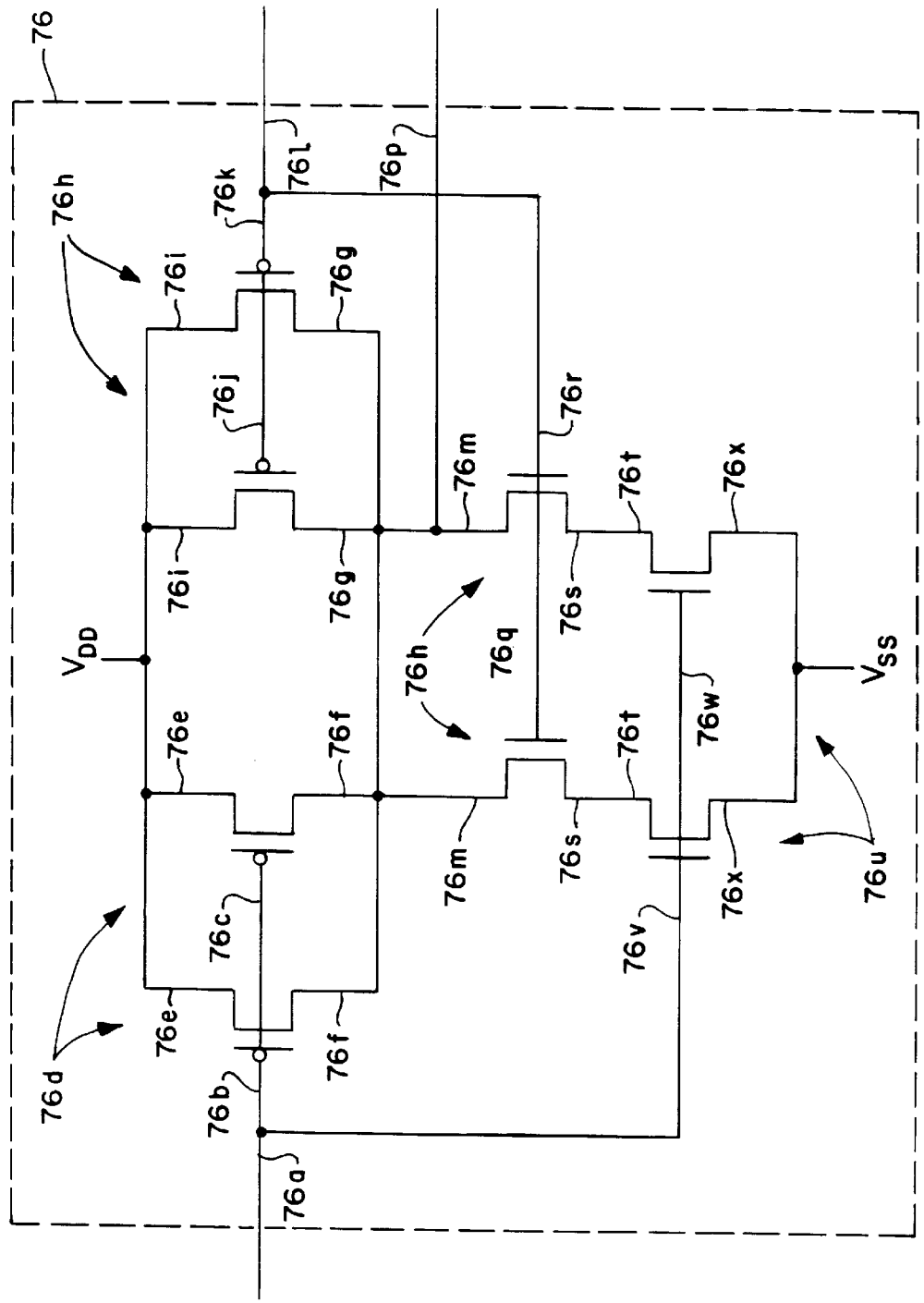
FIG. 4 is a schematic illustration of another element used in the embodiment of FIG. 2.

A schematic representation of the transistor level circuit for the NAND gate 76 of the first portion 72 is shown in FIG. 4. Referring now to FIG. 4, the NAND gate 76 has a first input 76a which is electrically connected to the gates 76b, 76c of a first pair 76d of P channel MOSFETs. The first pair 76d of P channel MOSFETs have their sources 76e electrically connected to $V_{DD}$ and their drains 76f electrically connected to the drains 76g of a second pair 76h of P channel MOSFETs. The sources 76i of the second pair 76h of P channel MOSFETs are connected to $V_{DD}$ and the gates 76j, 76j are connected to the second input signal 76l.

The drains 76f, 76g of both pairs 76d, 76h of P channel MOSFETs are further connected to the drains 76m of a first pair 76n of N channel MOSFETs and the output 76p of the NAND gate 76. The first pair 76n of N channel MOSFETs have their gates 76q, 76r connected to the second input 76l. Each of the sources 76s of the first pair 76n of N channel MOSFETs is connected to a different one of the drains 76t of a second pair 76u of N channel MOSFETs. The second pair 76u of N channel MOSFETs have their gates 76v, 76w connected to the first input 76a and their sources 76x connected to $V_{SS}$.

The operation of the NAND gate 76 is as follows. When both of the inputs are at a high logic state voltage, both pairs 76n, 76u of N channel MOSFETs are "on", i.e. low resistance, and both pairs 76d, 76h of P channel MOSFETs are "off", i.e. high resistance. At the output 76p, this produces a high resistance to the $V_{DD}$ supply and a low resistance to the $V_{SS}$ supply. The result is an output voltage of approximately $V_{SS}$, representing a low logic state. When one or more of the inputs 76a, 76l are at a low logic state voltage, the pair 76d, 76h of P channel MOSFETs having that input connected to its gate 76b, 76c are "on" and the pair 76n, 76s of N channel MOSFETs having that input connected to its gate are "off". At the output 76p, this produces a low resistance to the $V_{DD}$ supply and a high resistance to the $V_{SS}$ supply. The result is an output voltage of approximately $V_{DD}$, representing a high logic state.

Referring again to FIG. 2, the NAND gate 78 of the second portion 74 has a similar transistor level circuit schematic (not shown) and operation to that of the NAND gate 76 of the first portion 72. The first and second portions 72, 74 each operate on their respective input signals and produce first and second portion output signals which are summed, or combined, in analog fashion to produce a logic section output signal on line 84. The logic section output signal on line 84 takes on the logic state corresponding to the voltage of the analog combination. This is in contrast to a combination that combines the signals by performing a logical operation on each of their logic states.

In the best mode embodiment, the transistors in the NAND gates 76, 78 have "on" resistances in the range of from about 500 ohms to 5,000 ohms. Lower resistances are not required because the NAND gates do not to provide high magnitude output current. Accordingly, the connection should have an electrical resistance of about less than 500 ohms, preferably less than 10 ohms. In the best mode embodiment, a direct electrical connection having a resistance below 1 ohm, specifically about 0.01 ohms, is used. However, those skilled in the art will recognize that other suitable transistors having other "on" resistances, and other connections having other resistances may also be used.

Normally, the transistors of both of the NAND gates 76, 78 are in similar "on" and "off" states. Consequently, the voltage contributions from the first and second portions to the logic section output signal on line 84 are both approximately $V_{SS}$, or both approximately $V_{DD}$, and the combined signal, the logic section output signal on line 84, is also approximately $V_{SS}$, corresponding to a logic low, or $V_{DD}$, corresponding to a logic high.

Statistically, only one transistor will experience SEU at a given time. Thus when an ion transitions through the semiconductor one portion 72, 74 of the logic section 70, may experience SEU in one of the transistors in its NAND gate 76, 78. That transistor may change state from "on" to "off" or "off" to "on". However, any change in logic section output signal voltage on line 84, is small, since the output from the affected portion is combined, in analog fashion, as described above, with the output from the unaffected portion. Consequently, the voltage effect of the SEU is reduced, or attenuated. At or below the designed ion energy level of 80 MeVcm²/mg, there is insufficient energy in the ion to cause the logic section output signal on line 84 to transition to an incorrect logic state. Thus the logic section output signal on line 84 remains at the correct logic state throughout the SEU. The typical SEU lasts for about 20 nano seconds after which the transistor experiencing SEU returns to its prior state. Capacitance in the output portion, described hereinbelow, provides additional filtering for the small voltage changes in the logic section output signal on line 84.

In comparison to the present invention, other approaches, which may use a voting stage, tend to amplify the effect of the SEU because they first translate the affected signal to its own logic state prior to the voting stage, and then in the voting stage, they attempt to eliminate the effect of the SEU. These other approaches also require more gates, since they require a voting stage and often require three voting signals rather than just two, as in the present invention.

It should be recognized that this approach is not a typical method for the combination of logic signals from logic gates having active pull ups and pull downs in the output stage. For example, while open collector TTL gates may be wired-ANDed, the wired-ANDing of active pull up TTL gates is prohibitive due to the high power dissipation that occurs if one gate output is high and the other gate output is low. Similarly, in ECL logic, gates may be wired-ORed but the ECL output stage only has an active pull up and does not have an active pull down. However, in the present invention, the output of each CMOS gate does have both active pull up and active pull down.

Furthermore, unlike the TTL and ECL techniques above which seek to conserve logic gates while implementing standard logic functions, the summation approach of the present invention does not operate as a standard logic function. In fact, the summation here should not be used for combining logic signals which are not substantially similar in state and timing for the very reason that it does not provide a normal logical combination. Instead, it provides a means for combining substantially similar signals wherein a SEU failure in one of the signals does not cause failure of the combined signal.

The logic section output signal on line 84 is passed to an output section 86. Nodal capacitance, not shown, on line 84, provides some additional filtering for the logic section output signal. The output section 86 further comprises a pair of inverters 88, 90 for buffering of the signal. The pair of inverters 88, 90 are similar to that of the first inverter 42 of the A input signal buffer stage 34 with the exception that the transistors sizes are larger to reduce the likelihood that they themselves will experience SEU. Larger and stronger transistors are better able to resist SEU by counting the collection of charge through the substrate that is brought on by the entering ion. The pair of inverters 88, 90 are also larger to provide the desired capability for driving additional logic circuits that may be connected to the output logic signal Y on line 26. The output section further includes a pair of diodes 92, 94 to protect against under and over voltage damage.

Although the best mode of the present invention creates the logic section output signal on line 84 by combining the outputs from NAND gates 76, 78, those skilled in the art will recognize that other transistor configurations may also be suitable. For example, transistor configurations to be connected may also be of the type used in inverters.

In the best mode embodiment, in situations where the logic section is to provide sequential type logic, such as in a flip flop, additional features are incorporated in order to further insure SEU immunity. These additional features of the present invention are described with respect to a best mode embodiment for use in a logic is circuit providing the D-type flip flop (D flip flop) logic function, represented in FIG. 5.

Referring to FIG. 5, in a prior art schematic of a selected logic device, a flip flop circuit 100 receives a D input signal on line 102, a clock input signal on line 104, an asynchronous reset signal on line 106, and produces a Q output signal on line 108. The function of the D flip flop 100 is to transfer the logic state on the D input signal line 102 to the Q output signal line at the next rising edge on the clock signal line 104. Referring now to FIG. 6, a truth table 110 more fully details the operation of the flip flop 100. As shown in a first row 112, the Q output signal is forced to a low logic state when the reset signal is at a high logic state. Second and third rows 114, 116 indicate that so long as the reset line is at a low logic state, the Q output signal will go to the logic state of the D input after the rising edge on the clock line. As shown in a fourth row, the Q output signal is held constant while the clock line is in the low logic state.

Figure 7:
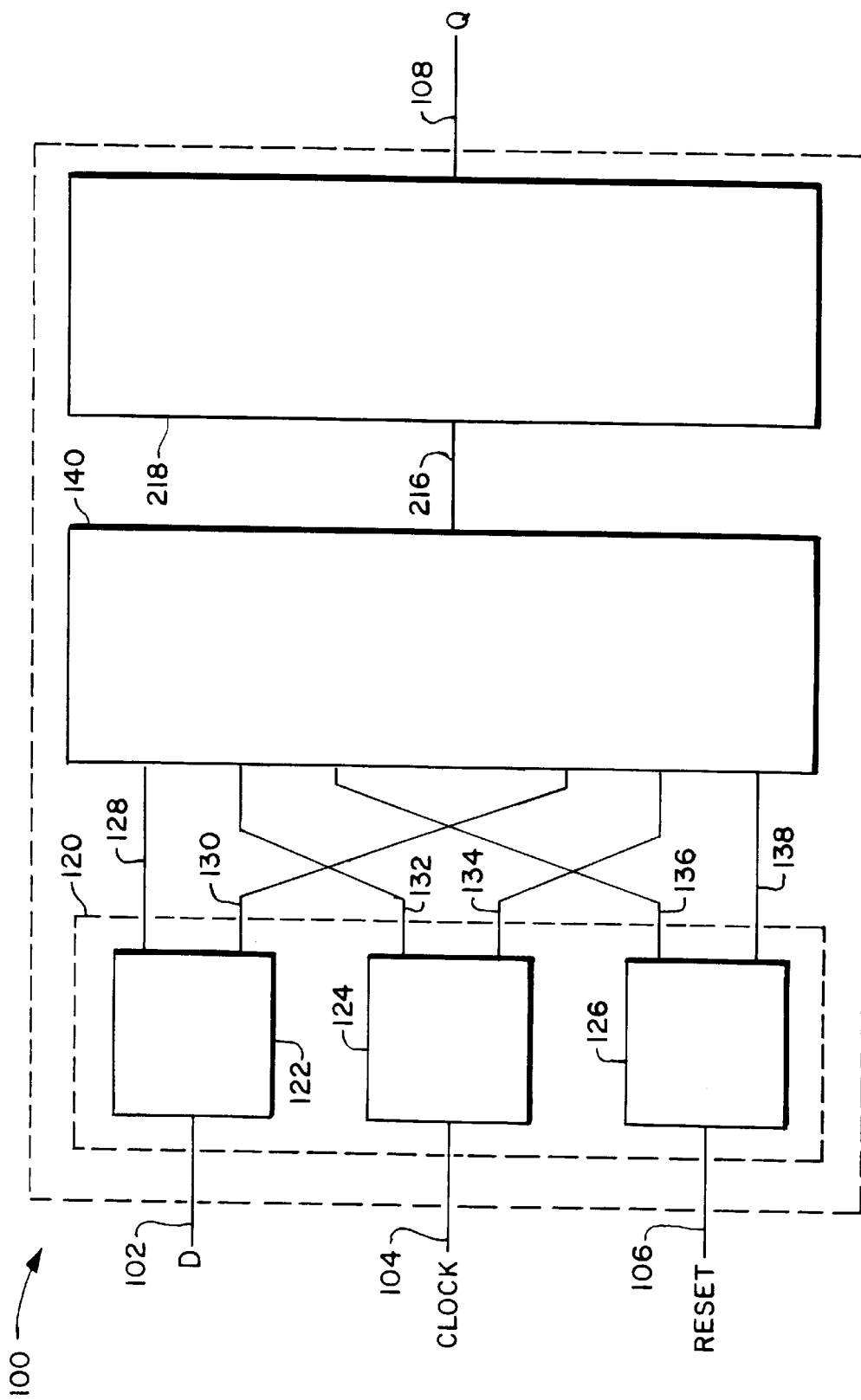
FIG. 7 is a block diagram illustration of the best mode embodiment of the present invention as used in the flip flop logic function of FIG. 5.

Referring now to FIG. 7, in a block diagram illustration of the best mode embodiment of the present invention as used in the flip flop logic function of FIG. 5, the D input signal on line 102, the clock input signal on line 104, and the reset input signal on line 106 are each presented to an input section 120. The input section comprises three signal conditioning circuits 122, 124, 126, each one receiving a different one of the three input signal lines 102, 104, 106. Each of the three signal conditioning circuits are identical to the signal conditioning circuits 29a, illustrated and described hereinabove with respect to FIG. 2, and produce a pair of buffered D signals on lines 128, 130, a pair of buffered clock signals on lines 132, 134, and a pair of buffered reset signals on lines 136, 138.

In the best mode embodiment, both of the signals in each pair of buffered signals must have the same logic state as each other, i.e. buffered D signals on lines 128, 130 must have the same logic state as each other, buffered clock signals on lines 132, 134 must have the same logic state as each other and buffered reset signals on lines 136, 138 must have the same logic state as each other. However, those skilled in the art will recognize that suitable alternative embodiments which do not require matching signals may also be used.

Figure 8:
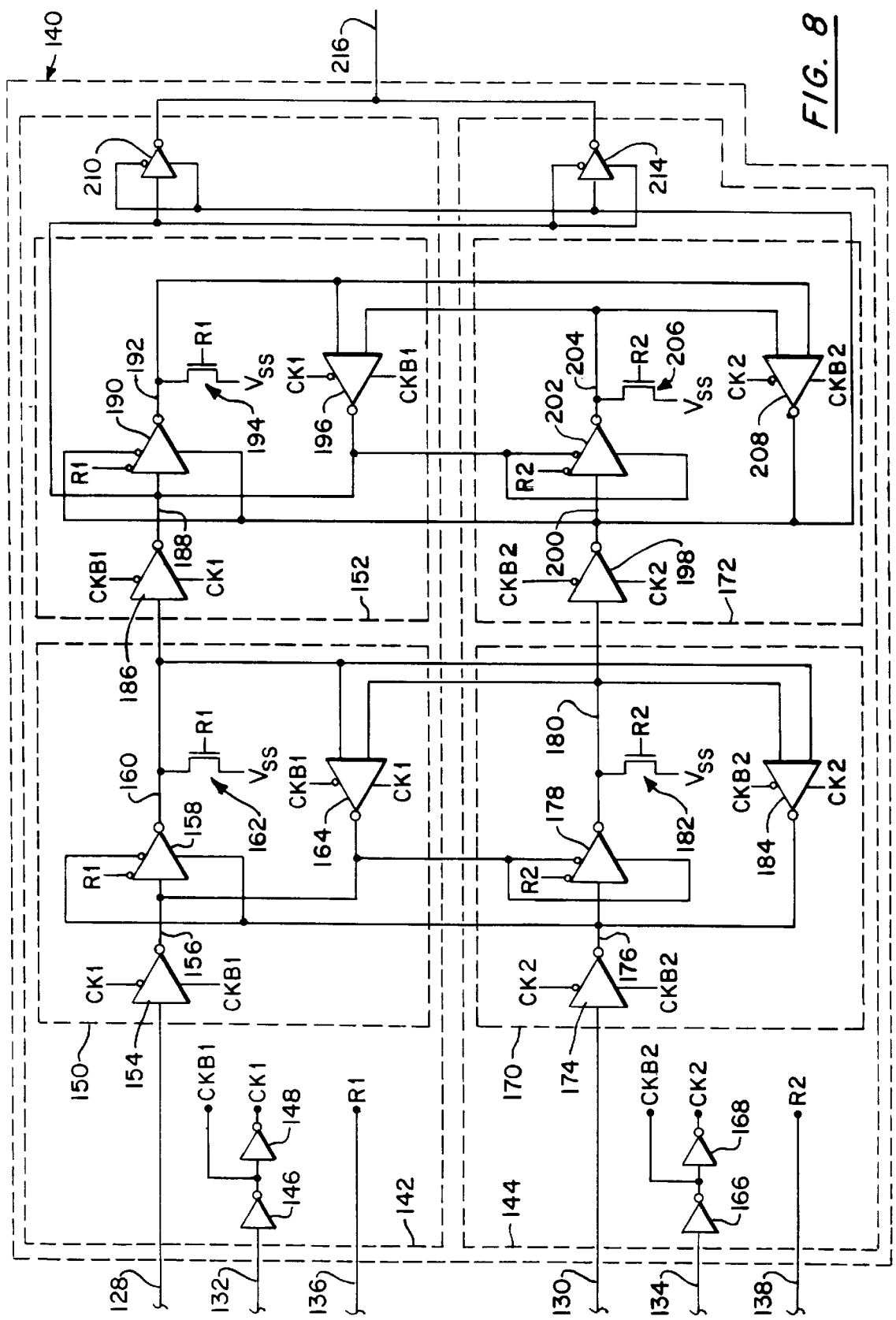
FIG. 8 is a schematic illustration of one section in the embodiment of FIG. 7.

The flip flop circuit 100 further comprises a logic section 140, for which the circuit schematic is illustrated in FIG. 8. Referring now to FIG. 8, the logic section 140 has a first portion 142 and a second portion 144, which each receive one signal from each of the D, clock, and reset buffered signal pairs on lines 128, 130, 132, 134, and 136, 138. In the best mode embodiment, the portions 142, 144, are physically spaced further apart than normal so that the effect of a single ion transitioning through the semiconductor structure is less likely to cause SEU in both portions 142, 144.

The first portion 142 receives the buffered clock signal on line 132 and presents it to an inverter 146, producing a CKB1 signal, which is provided throughout the first portion 142. The CKB1 signal is received by an inverter 148, producing a CK1 signal, which is also provided throughout the first portion 142. The first portion 142 receives the buffered reset signal (R1) on line 136 and provides it throughout the first portion 142.

Figure 9:
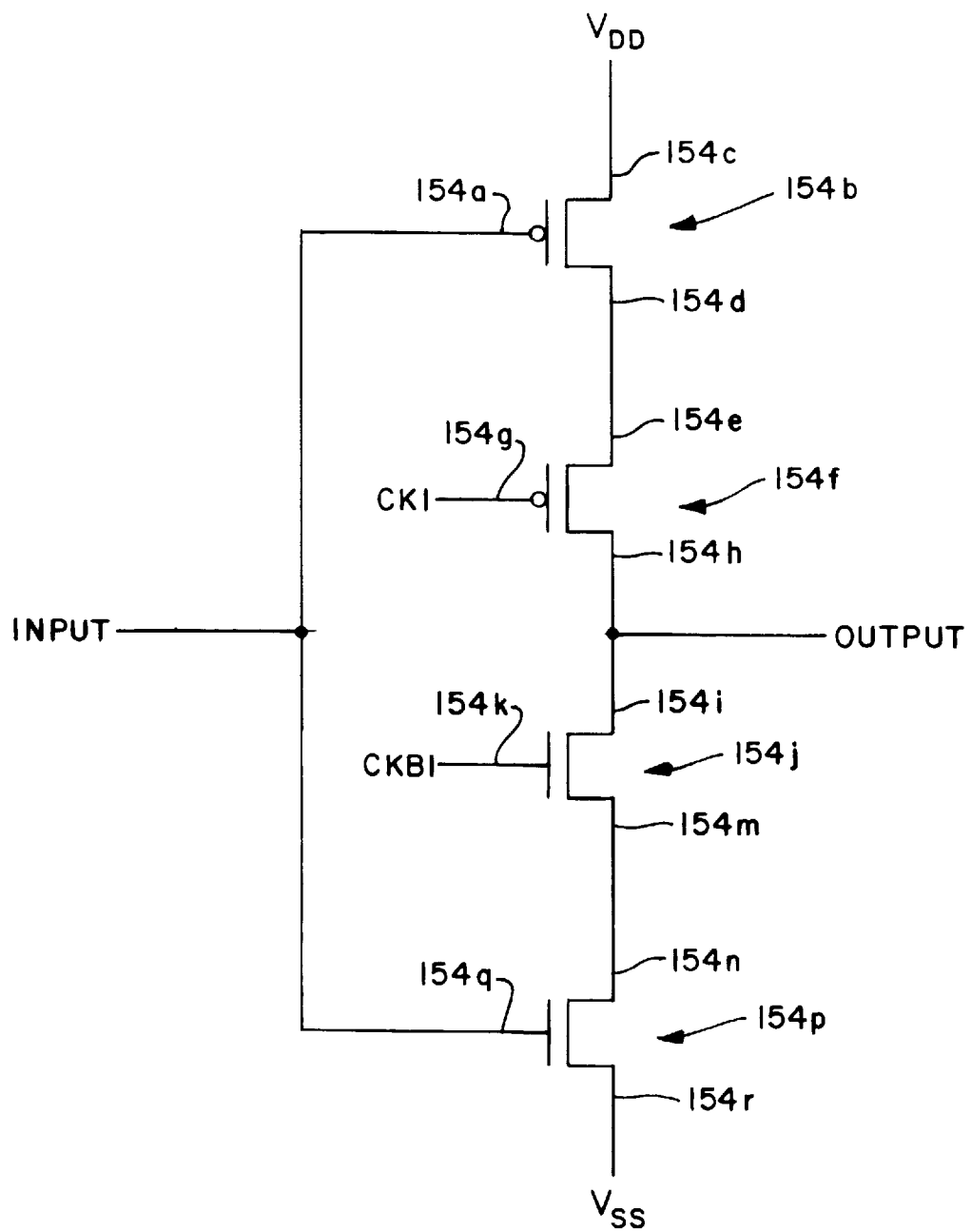
FIG. 9 is a schematic illustration of one element used in the embodiment of FIG. 7.

The first portion 142 further comprises master and slave memory cells 150, 152. The master memory cell 150 receives the buffered D signal on line 128 and presents it to a clocked inverter 154. FIG. 9 is a circuit for the clocked inverter 154 which presents the input to the gate 154a of a first P channel MOSFET 154b which has its source 154c connected to $V_{DD}$ and its drain 154d connected to the source 154e of a second P channel MOSFET 154f. The gate 154g of the second P channel MOSFET 154f is presented with the CK1 signal, and the drain 154h is connected to both the drain 154i of a first N channel MOSFET 154j and the output. The gate 154k of the first N channel MOSFET 154j is presented with the CKB1 signal, and the source 154m is connected to the drain 154n of a second N channel MOSFET 154p. The second N channel MOSFET 154p is presented with the input signal at its gate 154q and is connected at its source 154r to $V_{SS}$.

The operation of the clocked inverter 154 is as follows. When the CK1 signal is at a high logic state voltage, and the CKB1 signal is at a low logic state voltage, the second P channel MOSFET 154f and the first N channel MOSFET 154j are both "off", i.e. high resistance. In this condition the output of the clocked inverter 154 has a high resistance to both $V_{SS}$ and $V_{DD}$ regardless of the logic state of the input signal.

When the CK1 signal is at a low logic state voltage, and the CKB1 signal is at a high logic state voltage, the second P channel MOSFET 154f and the first N channel MOSFET 154j are both "on", i.e. low resistance. In this condition the clocked inverter 154 provides an output that is inverted with respect to the input. When the input is at a low logic state voltage, the first P channel MOSFET 154b is "on" and the second N channel MOSFET 154p is "off", thereby producing a high voltage on the output, approximately $V_{DD}$, representing a high logic state. When the input is at a high logic state voltage, the first P channel MOSFET 154b is "off" and the second N channel MOSFET 154p is "on", thereby producing a low voltage on the output, approximately $V_{SS}$, representing a low logic state.

Figure 10:
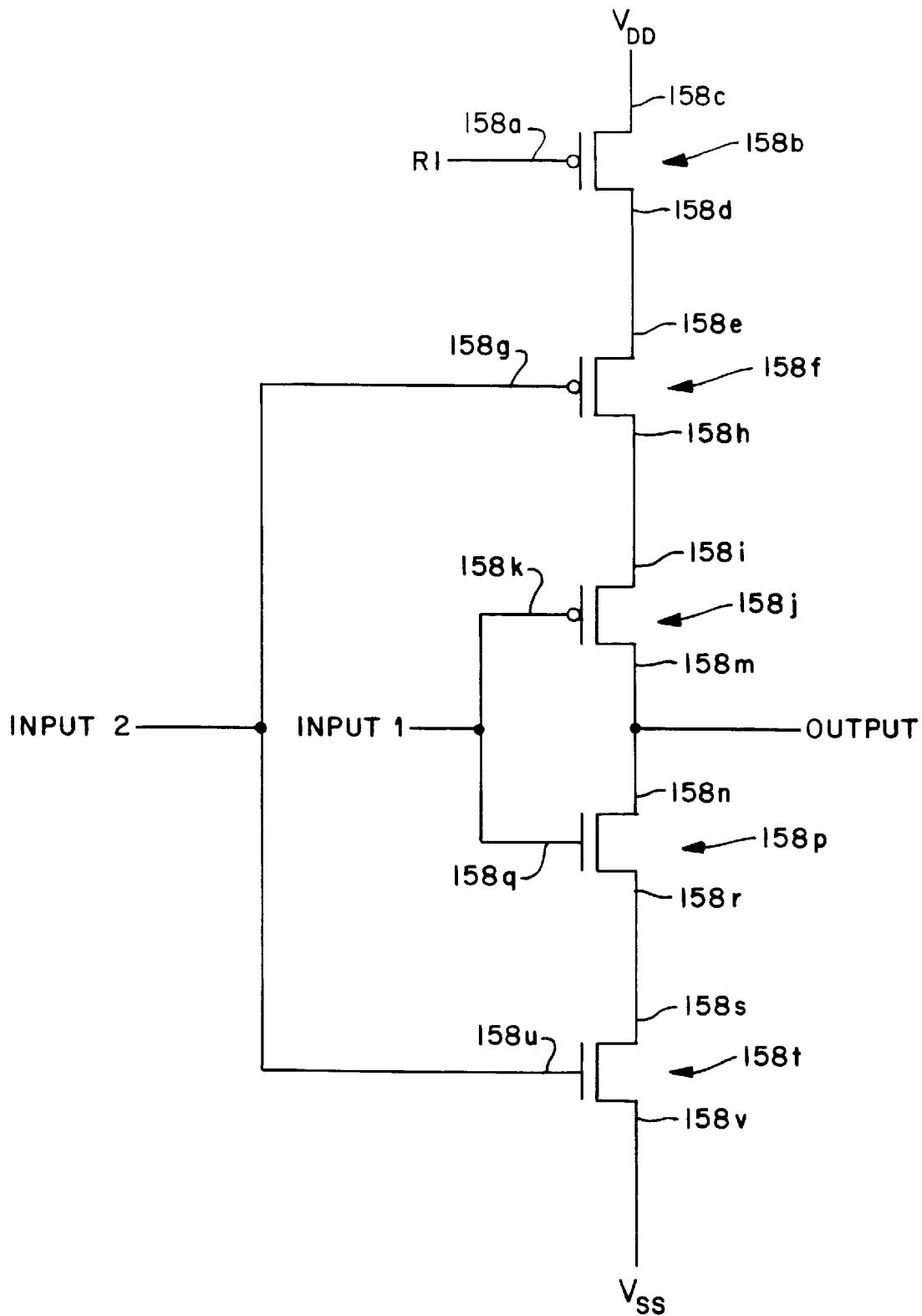
FIG. 10 is a schematic illustration of another element used in the embodiment of FIG. 7.

Referring again to FIG. 8, the output of the clocked inverter 154 on line 156 is input to a triple input three-state inverter 158. FIG. 10 is a circuit for the triple input three-state inverter 158 which presents the buffered reset signal (R1) to the gate 158a of a first P channel MOSFET 158b which has its source 158c connected to $V_{DD}$ and its drain 158d connected to the source 158e of a second P channel MOSFET 158f. The gate 158g of the second P channel MOSFET 158f is presented with the second input signal, input2, and the drain 158h is connected the source 158i of a third P channel MOSFET 158j. The gate 158k of the third P channel MOSFET 158j is presented with the first input signal, input1, and the drain 158m is connected to both the drain 158n of a first N channel MOSFET 158p and the output. The gate 158q of the first N channel MOSFET 158p is presented with the first input signal, input1, and the source 158r is connected to the drain 158s of a second N channel MOSFET 158t. The second N channel MOSFET 158t is presented with the second input signal, input2, at its gate 158u and is connected at its source 158v to $V_{SS}$.

The operation of the triple input three-state inverter 158 is as follows. When the buffered reset signal (R1) is at a high logic state voltage, the first P channel MOSFET 158b is "off". If both input1 and input2 are at a high logic state voltage, the second and third P channel MOSFETs 158f, 158j are "off", the first and second N channel MOSFETs 158p, 158t are "on", and the output of the triple input three-state inverter 158 is approximately $V_{SS}$. If input1 and input2 are not both at a high logic state, then the output of the triple input three-state inverter 158 will have high resistance to both $V_{SS}$ and $V_{DD}$.

When the buffered reset signal (R1) is at a low logic state voltage, the first P channel MOSFET 158b is "on". If both input1 and input2 are at a low logic state voltage, the second and third P channel MOSFETs 158f, 158j are "on", the first and second N channel MOSFETs 158p, 158t are "off", and the output of the triple input three-state inverter 158 is approximately $V_{DD}$. If both input1 and input2 are at a high logic state voltage, the second and third P channel MOSFETs 158f, 158j are "off", the first and second N channel MOSFETs 158p, 158t are "on", and the output of the triple input three-state inverter 158 is approximately $V_{SS}$. If input1 and input2 are not at the same logic state as each other, then the output of the triple input three-state inverter 158 will have high resistance to both $V_{SS}$ and $V_{DD}$.

Referring again to FIG. 8, the output of the triple input three-state inverter 158 is provided on line 160 to the drain of an N channel MOSFET 162. The gate of the N channel MOSFET 162 is presented with the buffered reset signal (R1) and the source is connected to $V_{SS}$. When the buffered reset signal (R1) is at a high level logic voltage, the N channel MOSFET 162 is "on" and the signal on line 160 is forced to approximately $V_{SS}$ volts. Otherwise, the N channel MOSFET 160 is "off" and has no effect.

Figure 11:
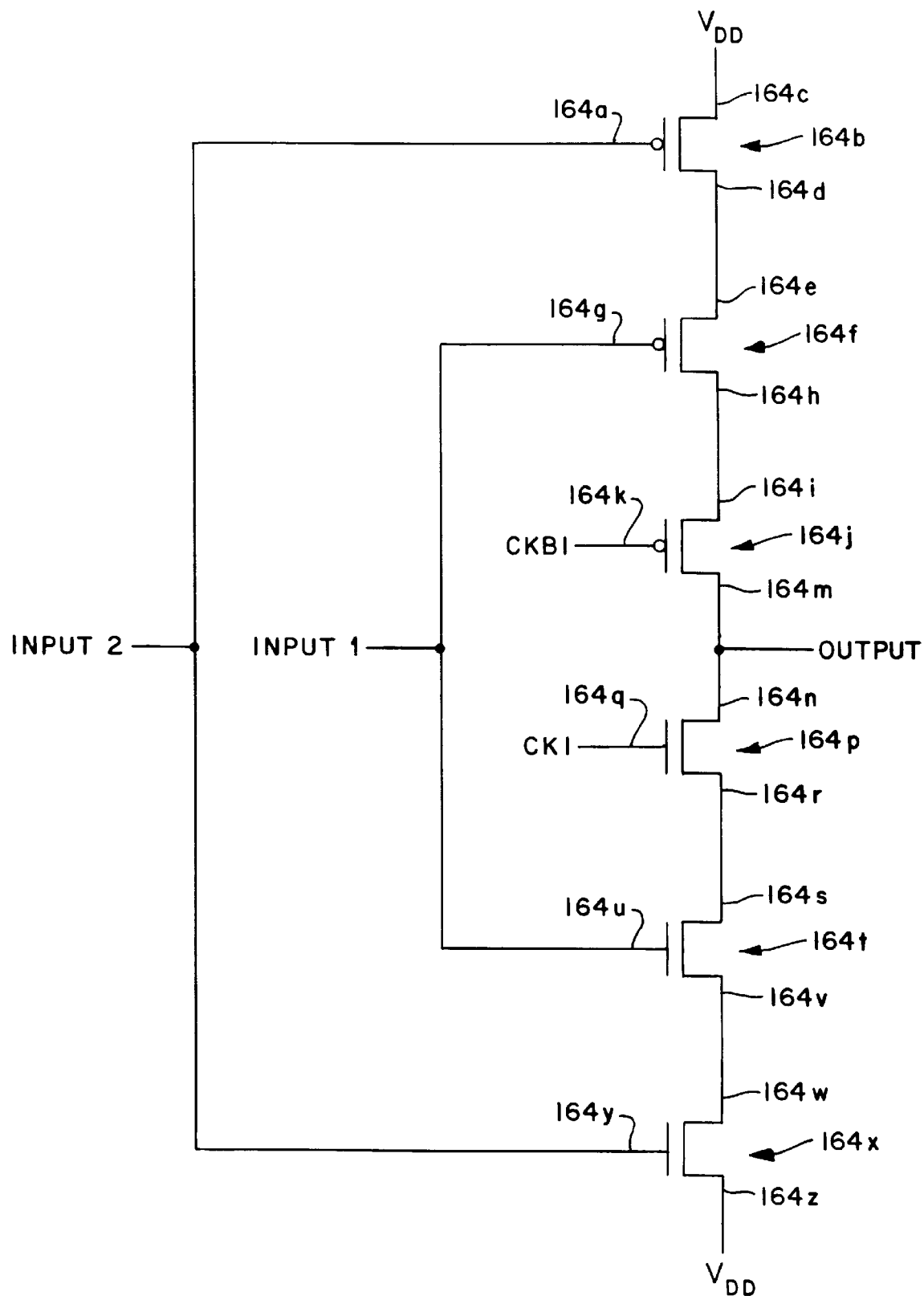
FIG. 11 is a schematic illustration of another element used in the embodiment of FIG. 7.

The signal on line 160 is also provided to the input of a clocked dual input inverter 164. FIG. 11 is a circuit for the clocked dual input inverter 164 which presents the second input signal, input2, to the gate 164a of a first P channel MOSFET 164b which has its source 164c connected to $V_{DD}$ and its drain 164d connected to the source 164e of a second P channel MOSFET 164f. The gate 164g of the second P channel MOSFET 164f is presented with the first input signal, input1, and the drain 164h is connected to the source 164i of a third P channel MOSFET 164j. The gate 164k of the third P channel MOSFET 164j is presented with the CKB1, and the drain 164m is connected to both the drain 164n of a first N channel MOSFET 164p and the output. The gate 164q of the first N channel MOSFET 164p is presented with the CK1 signal, and the source 164r is connected to the drain 164s of a second N channel MOSFET 164t. The second N channel MOSFET 164t is presented with the first input signal, input1, at its gate 164u and is connected at its source 164v to the drain 164w of a third N channel MOSFET 164x. The third N channel MOSFET 164t is presented with the second input signal, input2, at its gate 164y and is connected at its source 164z to $V_{SS}$.

The operation of the clocked dual input inverter 164 is as follows. When CKB1 is at a high logic state voltage and CK1 is at a low logic state voltage the third P channel MOSFET 164j and the first N channel MOSFET 164p are both "off" and the output of the clocked dual input inverter 164 will have high resistance to both $V_{SS}$ and $V_{DD}$.

When CKB1 is at a low logic state voltage and CK1 is at a high logic state voltage the third P channel MOSFET 164j and the first N channel MOSFET 164p are both "on". If both input1 and input2 are at a low logic state voltage, the first and second P channel MOSFETs 164b, 164f are "on", the second and third N channel MOSFETs 164t, 164x are "off", and the output of the clocked dual input inverter 164 is approximately $V_{DD}$. If both input1 and input2 are at a high logic state voltage, the first and second P channel MOSFETs 164b, 164f are "off", the second and third N channel MOSFETs 164t, 164x are "on", and the output of the clocked dual input inverter 164 is approximately $V_{SS}$. If input1 and input2 are not at the same logic state as each other, then the output of the clocked dual input inverter 164 will have high resistance to both $V_{SS}$ and $V_{DD}$. Referring again to FIG. 8, the output of the clocked dual input inverter 164 is fed back and connected to the input of the triple input three-state inverter 158 on line 156.

The second portion 144 of the logic section has similar circuitry to that described above for the first portion 142. The second portion 144 receives the buffered clock signal on line 134 and presents it to an inverter 166, producing a CKB2 signal, which is provided throughout the second portion 144. The CKB2 signal is received by an inverter 168, producing a CK2 signal, which is also provided throughout the second portion 144. The second portion 144 receives the buffered reset signal (R2) on line 138 and provides it throughout the second portion 144.

The second portion 144 further comprises master and slave memory cells 170, 172. The master memory cell 170 receives the buffered D signal on line 130 and presents it to a clocked inverter 174. The clocked inverter 174 has a similar circuit and operation to that of the clocked inverter 154, illustrated and described herein above with respect to FIG. 9, except that the clocked inverter 174 is presented with CK2 and CKB2 instead of CK1 and CKB1.

The output of the clocked inverter 174 on line 176 is input to a triple input three-state inverter 178. The triple input three-state inverter 178 has a similar circuit and operation to that of the triple input three-state inverter 158, illustrated and described herein above with respect to FIG. 10, except that the triple input three-state inverter 178 is presented with R2 instead of R1.

The output of the triple input three-state inverter 178 is provided on line 180 to the drain of an N channel MOSFET 182. The gate of the N channel MOSFET 182 is presented with the buffered reset signal (R2) and the source is connected to $V_{SS}$. When the buffered reset signal (R2) is at a high level logic voltage, the N channel MOSFET 182 is "on" and the signal on line 180 is forced to approximately $V_{SS}$ volts. Otherwise, the N channel MOSFET 180 is "off" and has no effect.

The signal on line 160 is also provided to the input of a clocked dual input inverter 184. The clocked dual input inverter 184 has a similar circuit and operation to that of the clocked dual input inverter 164, illustrated and described herein above with respect to FIG. 11, except that the clocked dual input inverter 184 is presented with CK2 and CKB2 instead of CK1 and CKB1. The output of the clocked dual input inverter 184 is fed back and connected to the input of the triple input three-state inverter 178 on line 176.

The master memory cells 150, 170 of the first and second portions 142, 144 are interconnected, or cross strapped, creating a dual memory cell having SEU immunity. The second portion 144 signal on line 176 is input to the first portion 142 triple input three-state inverter 158. Likewise, the first portion 142 signal on line 156 is input to the second portion 144 triple input three-state inverter 178. In addition, the second portion 144 signal on line 180 is input to the first portion 142 clocked dual input inverter 164. Likewise, the first portion 142 signal on line 160 is input to the second portion 144 clocked dual input inverter 184.

The first portion's 142 slave memory cell 152 has a similar circuitry to that described above for the first portion's 142 master memory cell 150, except as noted below. The slave memory cell 152 receives the signal on line 160 from the master memory cell 150 and presents it to a clocked inverter 186. The clocked inverter 186 has a similar circuit and operation to that of the clocked inverter 154, illustrated and described herein above with respect to FIG. 9, except that the clocked inverter 186 is connected to CK1 where the clocked inverter 154 is connected CKB1 and the clocked inverter 186 is connected to CKB1 where the clocked inverter 154 is connected CK1.

The output of the clocked inverter 186 on line 188 is input to a triple input three-state inverter 190. The triple input three-state inverter 190 has a similar circuit and operation to that of the triple input three-state inverter 158, illustrated and described herein above with respect to FIG. 10, except that the triple input three-state inverter 190 is connected to the second portion's 144 slave memory cell 172 instead of its master memory cell 170.

The output of the triple input three-state inverter 190 is provided on line 192 to the drain of an N channel MOSFET 194. The gate of the N channel MOSFET 194 is presented with the buffered reset signal (R1) and the source is connected to $V_{SS}$. When the buffered reset signal (R1) is at a high level logic voltage, the N channel MOSFET 194 is "on" and the signal on line 192 is forced to approximately $V_{SS}$ volts. Otherwise, the N channel MOSFET 194 is "off" and has no effect.

The signal on line 192 is also provided to the input of a clocked dual input inverter 196. The clocked dual input inverter 196 has a similar circuit and operation to that of the clocked dual input inverter 164, illustrated and described herein above with respect to FIG. 11, except that the clocked dual input inverter 196 is connected to CK1 where the clocked inverter 164 is connected CKB1 and the clocked inverter 196 is connected to CKB1 where the clocked inverter 164 is connected CK1. The output of the clocked dual input inverter 196 is fed back and connected to the input of the triple input three-state inverter 190 on line 188.

The second portion's 144 slave memory cell 172 has a similar circuitry to that described above for the first portion's 142 master memory cell 150, except as noted below. The slave memory cell 172 receives the signal on line 180 from the second portion 144 master memory cell 170 and presents it to a clocked inverter 198. The clocked inverter 198 has a similar circuit and operation to that of the clocked inverter 154, illustrated and described herein above with respect to FIG. 9, except that the clocked inverter 198 is connected to CK2 where the clocked inverter 154 is connected CKB1 and the clocked inverter 198 is connected to CKB2 where the clocked inverter 154 is connected CK1.

The output of the clocked inverter 198 on line 200 is input to a triple input three-state inverter 202. The triple input three-state inverter 202 has a similar circuit and operation to that of the triple input three-state inverter 158, illustrated and described herein above with respect to FIG. 10, except that the triple input three-state inverter 202 is presented with R2 instead of R1.

The output of the triple input three-state inverter 202 is provided on line 204 to the drain of an N channel MOSFET 206. The gate of the N channel MOSFET 206 is presented with the buffered reset signal (R2) and the source is connected to $V_{SS}$. When the buffered reset signal (R2) is at a high level logic voltage, the N channel MOSFET 206 is "on" and the signal on line 204 is force to approximately $V_{SS}$ volts. Otherwise, the N channel MOSFET 206 is "off" and has no effect.

The signal on line 204 is also provided to the input of a clocked dual input inverter 208. The clocked dual input inverter 208 has a similar circuit and operation to that of the clocked dual input inverter 164, illustrated and described herein above with respect to FIG. 11, except that the clocked dual input inverter 208 is connected to CK2 where the clocked inverter 164 is connected CKB1 and the clocked inverter 208 is connected to CKB2 where the clocked inverter 164 is connected CK1. The output of the clocked dual input inverter 208 is fed back and connected to the input of the triple input three-state inverter 202 on line 200.

The slave memory cells 152, 172 of the first and second portions 142, 144 are interconnected, or cross strapped, creating a dual memory cell having SEU immunity. The second portion 144 signal on line 200 is input to the first portion 142 triple input three-state inverter 190. Likewise, the first portion 142 signal on line 188 is input to the second portion 144 triple input three-state inverter 202. In addition, the second portion 144 signal on line 204 is input to the first portion 142 clocked dual input inverter 196. Likewise, the first portion 142 signal on line 192 is input to the second portion 144 clocked dual input inverter 208.

Figure 12:
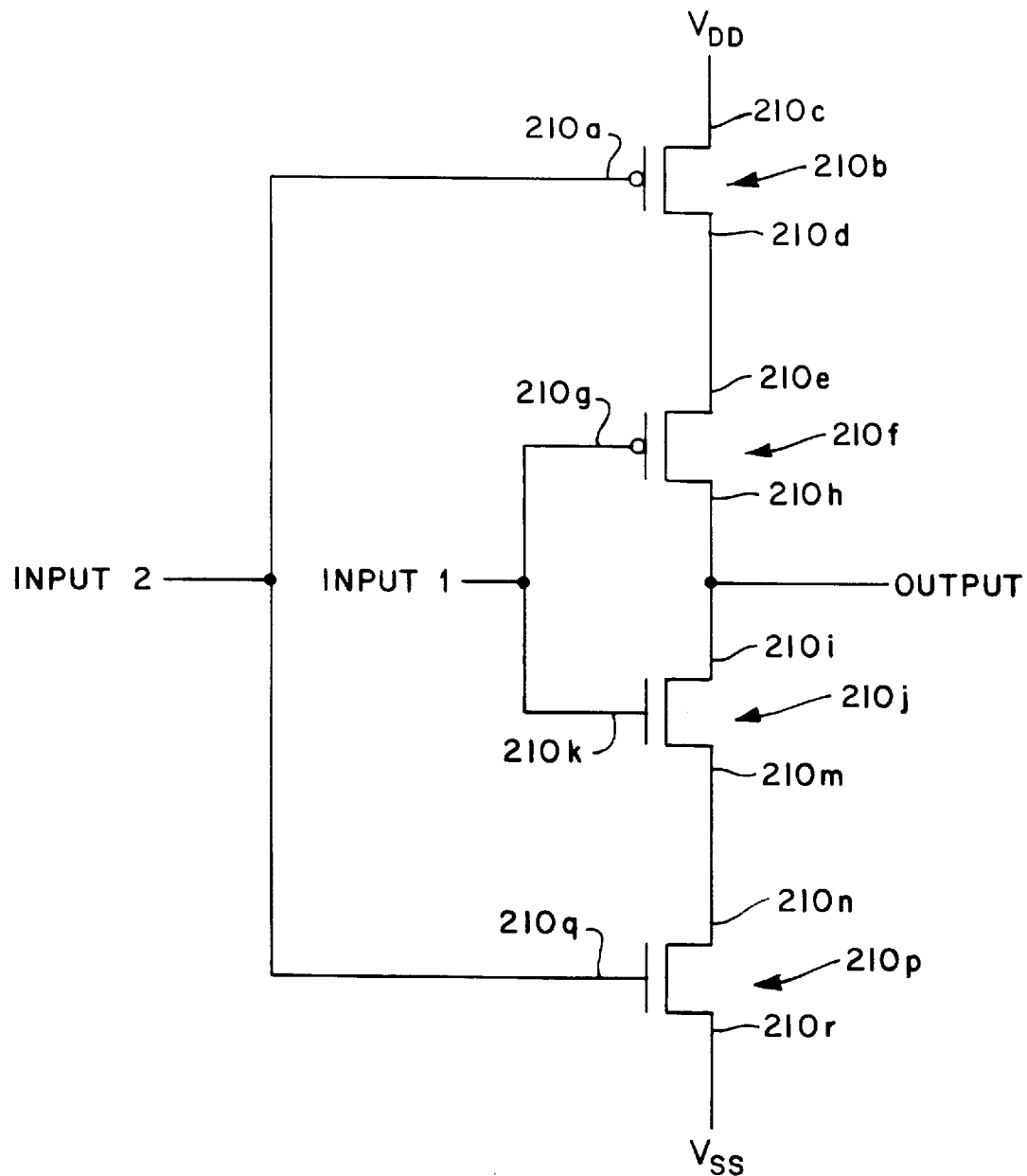
FIG. 12 is a schematic illustration of another element used in the embodiment of FIG. 7.

The signal on line 188 from the first portion 142 slave memory cell 152 and the signal on line 200 from the second portion 144 slave memory cell 172 are presented to dual input three-state inverters 210, 214 for the first and second portions 142 144, which provide output drive capability for the dual memory cell. Alternatively, one of the dual input three-state inverters 210, 214 may be omitted. FIG. 12 is a circuit for the dual input three-state inverter 210 which presents the input2 signal to the gate 210*a* of a first P channel MOSFET 210*b* which has its source 210*c* connected to $V_{DD}$ and its drain 210*d* connected to the source 210*e* of a second P channel MOSFET 210*f*. The gate 210*g* of the second P channel MOSFET 210*f* is presented with the input1 signal, and the drain 210*h* is connected to both the drain 210*i* of a first N channel MOSFET 210*j* and the output. The gate 210*k* of the first N channel MOSFET 210*j* is presented with the input1 signal, and the source 210*m* is connected to the drain 210*n* of a second N channel MOSFET 210*p*. The second N channel MOSFET 210*p* is presented with the input2 signal at its gate 210*q* and is connected at its source 210*r* to $V_{SS}$.

The operation of the dual input three-state inverter 210 is as follows. When both input1 and input2 are at a low logic state voltage, the first and second P channel MOSFETs 210*b*, 210*f* are "on", the first and second N channel MOSFETs 210*j*, 210*p*, are "off", and the output of the dual input three-state inverter 210 is approximately $V_{DD}$. When both input1 and input2 are at a high logic state voltage, the first and second P channel MOSFETs 210*b*, 210*f* are "off", the first and second N channel MOSFETs 210*j*, 210*p*, are "on", and the output of the dual input three-state inverter 210 is approximately $V_{SS}$. If input1 and input2 are not at the same logic state as each other, then the output of the dual input three-state inverter 210 will have high resistance to both $V_{SS}$ and $V_{DD}$. The dual input three-state inverter 214 has a similar circuit and operation to that of the dual input three-state inverter 210.

Referring again to FIG. 8, the outputs of the dual input three-state inverters 210, 214 are connected to produce a logic section output signal on line 216. This connection and resulting signal are identical to the connection of the outputs of the NAND gates 76, 78 producing logic section output signal 84 illustrated and described hereinabove with respect to FIG. 2.

The operation of the logic section 140 is as follows. When the buffered clock signals (CK1, CK2) are at low logic state voltages (logic low), the inverted clock signals (CKB1, CKB2 are at high logic state voltages (logic high) and the clocked inverters 154, 174 of the master memory cells 150, 170 provide output signals on lines 156, 176 at voltages that correspond to the opposite logic state compared to that of the buffered D signals (D) on lines 128, 130. The triple input three-state inverters 158, 164 provide output signals on lines 160, 180 having the same logic state as D. The outputs of the clocked dual input inverters 164, 184 on lines 156, 176 are in the high resistance condition and therefore have no effect. The signals on lines 160, 180 from the master memory cells 150, 170 are presented to slave memory cells 152, 172, but do not effect the signals on lines 188, 200 because the outputs of the clocked inverters 186, 198 are in the high resistance condition.

When the buffered clock signals (CK1, CK2) transition to a logic high, the inverted clock signals (CKB1, CKB2) are at logic low and the outputs of the clocked inverters 154, 174 of the master memory cells 150, 170 transition to the high resistance condition. The outputs of the clocked dual input inverters 164, 184 on lines 156, 176 transition to the logic state corresponding to that opposite the logic state of D prior to the transition of CK1, CK2. The triple input three-state inverters 158, 178 provide output signals on lines 160, 180 corresponding to the logic state of D prior to the transition of CK1, CK2.

The signals on lines 160, 180 from the master memory cells 150, 170 are presented to the clocked inverters 186, 198 of the slave memory cells 152, 172. The outputs of the clocked inverters 186, 198 on lines 188, 200 transition to the logic state corresponding to that opposite the logic state of D prior to the transition of CK1, CK2. The outputs of the triple input three-state inverters 190, 202 on lines 192, 204 transition to the logic state corresponding to that of D prior to the transition of CK1, CK2. The outputs of the clocked dual input inverters 196, 208 on lines 188, 200 transition to the high resistance condition. The dual input inverters 210, 214 receive the signals on line 188, 200 and provide the logic section output signal on line 216 having a logic state corresponding to that of D prior to transition of CK1, CK2.

When the buffered clock signals (CK1, CK2) transition again, back to a logic low, the inverted clock signals (CKB1, CKB2) are at logic high. The outputs of the triple input three-state inverters 190, 202 on lines 192, 204 retain the logic state corresponding to that of D prior to the first transition of CK1, CK2. The outputs of the clocked dual input inverters 196, 208 on lines 188, 200 transition to the logic state corresponding to that opposite the logic state of D prior to the first transition of CK1, CK2.

As described above, the logic section 140 of the flip flop 100 (FIG. 5–7) comprises a two dual memory cells, a master, and a slave. Although a transistor in either of the dual memory cells may experience SEU, the outputs of the dual memory cells remain at the correct logic state. This is due to the fact that the dual memory cell has two portions, the first and second, which are uniquely interconnected. The operation of the dual memory cells in the presence of SEU is explained below.

Assume prior to SEU, D is at a logic low, CK1, CK2 transition from logic low to logic high, and CKB1, CKB2 transition to logic low. The outputs of the clocked inverters 154, 174 on lines 156, 176 of the master memory cells 150, 170 transition to the high resistance condition. The outputs of the clocked dual input inverters 164, 184 on lines 156, 176 transition to a logic high, the logic state corresponding to that opposite the logic state of D prior to the transition of CK1, CK2. The triple input three-state inverters 158, 178 provide logic low output signals on lines 160, 180 corresponding to the logic state of D prior to the transition of CK1, CK2.

If a transistor in the clocked dual input inverter 164 experiences SEU, causing the output of the clocked dual input inverter 164 on line 156 to transition to a logic low, then the output of the triple input three-state inverter 158 on line 160 transitions to the high resistance condition. However, nodal capacitance associated with the wiring and the gates connected to line 160 retains the voltage on line 160 at a logic low. Thus, the inverter 164 and the slave memory cell 152 remain presented with the correct logic state voltage. As the transistor experiencing SEU recovers, the logic low on line 160 and logic low on line 180, restore the output of the clocked dual input inverter 164 on line 184 to a logic high.

If instead a transistor in the clocked inverter 154 experiences SEU, then at worst, and the output on line 156 transitions from a high resistance condition to a logic low. The output of the triple input three-state inverter 158 transitions at worst to a high resistance condition, and the voltage on line 160 is undisturbed and retained by nodal capacitance. Thus, the inverter 164 and the slave memory cell 152 remain presented with the correct logic state voltage. As soon as the SEU passes, the output of the clocked inverter 154 returns to a high resistance condition and the clocked dual input three-state inverter 164 restores the logic high state on line 156.

If instead a transistor in the triple input three-state inverter 158 experiences SEU, then at worst its output on line 160 transitions to the high resistance condition. However, the voltage on line 160 is retained by nodal capacitance. Thus, the inverter 164 and the slave memory cell 152 remain presented with the correct logic state voltage, and the triple input three-state inverter 158 recovers after the SEU.

Now assume prior to SEU, D and CK1 are at logic low. The output of the clocked inverter 154 on line 156 is at a logic high. The triple input three-state inverter 158 output on line 160 is at a logic low. The clocked dual input inverter 164 output is at the high resistance condition.

If a transistor in the clocked dual input inverter 164 experiences SEU, causing its output on line 156 to transition to a logic high, there is no problem because the signal on line 156 is already a logic high. Thus, the triple input three-state inverter 158, the inverter 164 and the slave memory cell 152 remain presented with the correct logic state voltages. As the transistor experiencing SEU recovers, the output of the clocked dual input inverter 164 on line 156 returns to a high resistance condition.

If instead a transistor in the clocked inverter 154 experiences SEU, at worst the signal on line 156 transitions to a logic low and the output of the triple input three-state inverter 158 on line 160 transitions to the high resistance condition. The voltage on line 160 is retained by nodal capacitance, thus, the inverter 164 and the slave memory cell 152 remain presented with the correct logic state voltage. All recover to its proper state after the SEU.

If instead a transistor in the triple input three-state inverter 158 experiences SEU, its output on line 160 at worst transitions to the high resistance condition. As with the examples above, the voltage on line 160 is undisturbed and retained by nodal capacitance. The clocked dual input inverter 164 and the slave memory cell 152 remain presented with the correct logic state voltage, and the triple input three-state inverter 158 recovers after the SEU.

Thus the proper logic state is retained in the case of SEU, at least for ion energy levels up to and including 80 MeVcm²/mg. Memory cell 170 operates identically to its dual memory cell 150. The slave dual memory operates similarly to the master dual memory cell.

The best mode embodiment incorporates triple input three-state inverters 158, 178, 190, 202 in order to provide asynchronous reset capability. Alternatively, if asynchronous reset is not desired, then dual input three-state inverters may be used instead, such as those used for dual input three-state inverters 210, 214. In such situations the N channel MOSFETs 162, 182, 194, 206 may also be omitted.

Referring again to FIG. 7, the logic section output signal on line 216 is presented to an output section 218, which is identical to the output section 86, illustrated and described hereinabove with respect to FIG. 2. The output section 218 provides the Q output signal on line 108.

Although in the best mode embodiment, the outputs of the dual input and triple input three-state inverters transition to a high resistance condition when the inputs to the inverter are not at the same logic state as each other, i.e. during SEU. In the high resistance condition, there is a high resistance between the output, and both $V_{SS}$ and $V_{DD}$, so the output does not disturb the voltage on the line, stored in the nodal capacitance. Therefore, the rest of the circuit is not affected by the SEU. However, as those of ordinary skill in the art will recognize, the inverters may be replaced by any suitable transistor configuration which allows the dual memory cell to suitably respond when the corresponding signals from the two memory cells do not agree.

Furthermore, although in the best mode embodiment, each memory cell provides two signals, where one is the complement of the other, to the other memory cell in the dual memory cell, those of ordinary skill in the art will recognize that only one signal need be provided by each memory cell to its dual memory cell.

In the best mode embodiment, the NAND circuit 20 and the flip flop circuit 100 are implemented in CMOS technology, preferably 1.2 micro meters (um) or smaller, however, any other suitable technology may also be used. At 1.2 um the circuit is small enough in size, has relatively low power, and provides high speed operation.

As with all circuitry, appropriate decoupling should be used when employing the present invention.

In the best mode embodiment, each of the logic signals on lines 22, 24, 26 and lines 102, 104, 106, 108 are of the type having CMOS logic levels, however, as will be obvious to those skilled in the art, the NAND logic circuit 20 and the flip flop circuit 100 may also be designed to accommodate TTL logic signals. In the preferred embodiment, this only requires threshold modifications in the input section.

While the best mode of the present invention includes an input section, the logic section of the present invention may also be used without the input section or portions of the input section. For example, each input logic signal may be routed directly to both portions of the logic section, without passing through the input section, so long as the logic section is suitably adapted for operation with the logic levels of the input logic signals.

The present invention may also be used without the output section of the best mode embodiment. Instead, the logic section output signal may be used to drive other logic directly so long as the logic section is suitably adapted for driving such other logic.

Although disclosed with respect to best mode embodiments for use in NAND and master slave D flip flop circuits, the present invention may be used in combinatorial and sequential logic circuits of any type including but not limited to that of OR, NOR, XOR, XNOR, inverter, AND, buffer, line drivers and transceivers, with or without three-state, one dual memory cell, JK flip flop, SR flip flop, with or without preset and clear.

Furthermore, while the NAND circuit of the present invention has 2 inputs and 1 output and the master slave D flip flop circuit has 3 inputs and 1 output, the present invention may be used in logic circuits having any number of inputs, e.g. N, where N is one or more, and any number of outputs, e.g. K, where K is one or more. The input section still preferably receives each of the N input signals and produces a pair of buffered signals for each. One signal from each pair of buffered signals is received by the first portion of the logic section and the other signal from each pair is received by the second portion. Each of the two logic section portions has all of the necessary logic gates for implementing the overall function. The first portion produces K first portion output signals and the second portion produces K second portion output signals. Each of the K first portion output signals is combined with the counterpart signal from the K second portion output signals to produce K logic section output signals. The K logic section output signals are passed to the output section where they are buffered to produce the K outputs for the circuit. As such, the present invention may also be used in logic circuits of the type including but not limited to comparators, flip flops, decoders/demultiplexers, selectors/multiplexers, counters, shift registers, parity generators, adders, and memories.

Still further, although the best mode embodiment uses signal conditioning circuits that provide a pair of buffered signals and logic sections having two portions, signal conditioning circuits providing more than a pair of buffered signals and logic sections having more than two portions may also be used and similarly combined to provide even greater immunity to SEU.

While the particular invention has been described with reference to illustrative embodiments, this description is not meant to be construed in a limiting sense. It is understood that, various modifications of the illustrative embodiments, as well as additional embodiments of the invention, will be apparent to persons skilled in the art upon reference to this description without departing from the spirit of the invention, as recited in the claims appended hereto. Thus, upon understanding the present invention, one of ordinary skill in the art could employ the present invention in a variety of logic circuit applications. Those skilled in the art will know of the forms which are suitable for each application. It is therefore contemplated that the appended claims will cover any such modifications or embodiments as fall within the true scope of the invention.

What is claimed is:

1. A dual memory cell having a first and second memory cell, comprising:

said first memory cell receiving a first input signal and providing a first logic signal; and said second memory cell receiving a second input signal and providing a second logic signal, said second memory cell further receiving said first logic signal to produce a second output signal, and said first memory cell further receiving said second logic signal to produce a first output signal, wherein said first memory cell produces said first output signal having a logic state in response to said first input signal having a first logic state and said second logic signal having an expected logic state and, said first memory cell having a high impedance at said first output signal when either said first input signal is not at said first logic state or said second logic signal is not at said expected logic state, and wherein said first memory cell has sufficient nodal capacitance to maintain said first output signal at said logic output for a time period when said high impedance is at said first output signal, and wherein said second memory cell produces said second output signal having said logic state in response to said second input signal having said first logic state and said first logic signal having said expected logic state and, said second memory cell having said high impedance at said second output signal when either said second input signal is not at said first logic state or said first logic signal is not at said expected logic state and wherein said second memory cell has sufficient nodal capacitance to maintain said second output signal at said logic output for said time period when said high impedance is at said second output signal.

2. The dual memory cell of claim 1 wherein said first output signal of said first memory cell and said second output signal of said second memory cell are further combined in analog fashion to provide one logic state output signal.

3. The dual memory cell of claim 1 wherein said first output signal of said first memory cell and said second output of said second memory cell are provided by logic gates located in said first and second memory cells for providing said first and second output signals having outputs with active pull ups and active pull downs.

4. The dual memory cell of claim 1 wherein said first and second memory cells comprises CMOS technology.

5. The dual memory cell of claim 2 wherein said combination in analog fashion of said first output signal of said first memory cell and said second output signal of said second memory cell comprises an electrical connection having a resistance of about less than 500 ohms.

6. The dual memory cell of claim 1 wherein said first memory cell and said second memory cell comprise identical logic circuitry.

7. The dual memory cell of claim 1 wherein said first memory cell and said second memory cell are physically spaced apart to prevent an ion having an energy level of up to and including 80 MeVcm$^2$/mg from causing SEU in both portions.

8. The dual memory cell of claim 2 wherein said combination in analog fashion of said first output signal of said first memory cell and said second output signal of said second memory cell produces said one logic state output signal having immunity to SEU at ion energy levels of up to and including 80 MeVcm$^2$/mg.

9. The dual memory cell of claim 2 wherein said combination in analog fashion of said first output signal of said first memory cell and said second output signal of said second memory cell has a resistance of about less than 1 ohm.

10. The dual memory cell of claim 1 wherein said first and second memory cells each comprises circuits having three-state outputs wherein a first state corresponds to an output driven by $V_{DD}$, a second state corresponds to an output driven by $V_{SS}$ and a third state corresponds to high resistance to both $V_{SS}$ and $V_{DD}$ wherein said logic state equals either said first state driven by $V_{DD}$ or said second state driven by $V_{SS}$ and wherein said high impedance is equal to said high resistance to both $V_{SS}$ and $V_{DD}$.

11. Apparatus for performing a selected logic function on one or more logic state input signals presented thereto to provide one or more resultant logic output signals, comprising:

an input section having a signal conditioning circuit for each of the logic state input signals, for providing for each of the logic state input signals, a pair of buffered logic state signals; and a logic section having a first and second portion, each receiving one buffered logic state signal from each of said pairs of buffered logic state signals, and each performing the selected logic function on said buffered logic state signals received thereby to each provide one or more first memory cell inputs and one or more second memory cell inputs, said first portion having a first memory cell and said second portion having a second memory cell, said first memory cell further receiving said first memory cell inputs to produce one or more first intermediate outputs, and said second memory cell further receiving said second memory cell inputs to produce said one or more second intermediate outputs, said first memory cell further receiving said second intermediate outputs to produce one or more first memory cell outputs, and said second memory cell further receiving said first intermediate signals to produce one or more second memory cell outputs, wherein, said first memory cell outputs are a logic state output when said first memory cell inputs and said second intermediate outputs are at an expected logic state and wherein said first memory cell outputs are at a high impedance whenever said first memory cell inputs or said second intermediate outputs are not at said expected logic state and wherein said first memory cell has sufficient nodal capacitance wherein said first memory cell outputs are maintained at said logic state output for a time period when said high impedance is at said first memory cell outputs, wherein said second memory cell outputs are said logic state output when said second memory cell inputs and said first intermediate outputs are at said expected logic state and wherein said second memory cell outputs are at said high impedance whenever said second memory cell inputs or said first intermediate outputs are not at said expected logic state, and wherein said second memory cell has sufficient nodal capacitance wherein said second memory cell outputs are maintained at said logic state output for said time period when said high impedance is at said second memory cell outputs, and wherein each of said first memory cell outputs are combined in analog fashion with said second memory cell outputs to provide one or more logic section output signals.

12. The apparatus of claim 11 wherein said one or more first and second memory cell outputs are provided by logic gates located in said first and second memory cells for providing said one or more first and second memory cell outputs having outputs with active pull ups and active pull downs.

13. The apparatus of claim 11 wherein said first and said second portions of said logic section comprise CMOS technology.

14. The apparatus of claim 11 wherein said combination in analog fashion of said one or more first memory cell outputs and said one or more second memory cell outputs comprises an electrical connection having a resistance of about less than 500 ohms.

15. The apparatus of claim 11 wherein said first portion and said second portion of said logic section comprise identical logic circuitry.

16. The apparatus of claim 11 wherein said first portion of said logic section and said second portion of said logic section are physically spaced apart to prevent the an ion having an energy level of up to and including 80 MeVcm$^2$/mg from causing SEU in both portions.

17. The apparatus of claim 11 wherein said output section comprises circuitry that is immune to SEU at ion energy levels of up to and including 80 MeVcm$^2$/mg.

18. The apparatus of claim 11 wherein said one or more logic section output signals are immune to SEU at ion energy levels of up to and including 80 MeVcm$^2$/mg.

19. The apparatus of claim 11 wherein said input section, said logic section, and said output section are on the same integrated circuit.

20. The apparatus of claim 11 wherein said input section comprises, for each of the N input signals, a pair of identical buffer stages that produce said pair of buffered signals.

21. The apparatus of claim 11 wherein for each of said pair of buffer stages, one of said pair of buffer stages is physically separated from the other of said pair of buffer stages to prevent an ion having an energy level of up to and including 80 MeVcm$^2$/mg from causing SEU in both buffer stages.

22. The apparatus of claim 11 wherein said combination in analog fashion of said first memory cell outputs and said second memory outputs has a resistance of about less than 1 ohm.

23. The method of connecting a first memory cell having a first output and a second memory cell having a second output to provide a radiation resistant resultant output signal comprising the steps of:

presenting the first memory cell with a first input to produce a first intermediate output;

presenting the second memory cell with; a second input to produce a second intermediate output;

presenting the first memory cell with said second intermediate output to produce said first output having a logic state when said first input and said second intermediate output are at an expected logic state and wherein said first output is at a high impedance whenever said first input or said second intermediate output are not at said expected logic state and wherein said first memory cell has sufficient nodal capacitance wherein said first output is maintained at said logic state for a time period when said first output is at said high impedance;

presenting the second memory cell with said first intermediate output to produce a second output having said logic state when said second input and said first intermediate output are at said expected logic state and wherein said second output signal is at said high impedance whenever said second input or said first intermediate output are not at said expected logic state and wherein the second memory cell has sufficient nodal capacitance wherein said second output signal is maintained at said logic output for said time period when said second output is at said high impedance; and combining said first and second outputs in analog fashion to provide said radiation resistant resultant output signal.

* * * * *